US009556507B2

(12) United States Patent
Duan et al.

(10) Patent No.: US 9,556,507 B2
(45) Date of Patent: Jan. 31, 2017

(54) YTTRIA-BASED MATERIAL COATED CHEMICAL VAPOR DEPOSITION CHAMBER HEATER

(71) Applicant: Applied Materials, Inc., Santa Clara, CA (US)

(72) Inventors: Ren-Guan Duan, Fremont, CA (US); Juan Carlos Rocha-Alvarez, San Carlos, CA (US); Jianhua Zhou, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 185 days.

(21) Appl. No.: 14/199,745

(22) Filed: Mar. 6, 2014

(65) Prior Publication Data

US 2014/0263272 A1    Sep. 18, 2014

Related U.S. Application Data

(60) Provisional application No. 61/782,217, filed on Mar. 14, 2013.

(51) Int. Cl.

| | |
|---|---|
| H05B 3/68 | (2006.01) |
| C23C 4/10 | (2016.01) |
| C23C 16/44 | (2006.01) |
| C23C 16/458 | (2006.01) |
| H05B 3/14 | (2006.01) |

(52) U.S. Cl.
CPC ............... *C23C 4/105* (2013.01); *C23C 4/11* (2016.01); *C23C 4/134* (2016.01); *C23C 16/4404* (2013.01); *C23C 16/4581* (2013.01); *H05B 3/143* (2013.01)

(58) Field of Classification Search
CPC ........ C23C 4/105; C23C 4/127; C23C 16/405; C23C 16/403; C23C 16/4404; C23C 16/4581; C23C 16/4405; H05B 3/68; H05B 3/143; H01J 37/3244; H01J 9/20

See application file for complete search history.

(56) References Cited

U.S. PATENT DOCUMENTS

| | | | |
|---|---|---|---|
| 7,696,117 B2 * | 4/2010 | Sun | ........................ C04B 35/111 |
| | | | 156/345.1 |
| 2006/0266288 A1 | 11/2006 | Choi | |
| 2008/0029195 A1 * | 2/2008 | Lu | ........................... H05B 3/143 |
| | | | 156/1 |

FOREIGN PATENT DOCUMENTS

WO    2012115913 A2    8/2012

\* cited by examiner

*Primary Examiner* — Shawntina Fuqua
(74) *Attorney, Agent, or Firm* — Patterson & Sheridan, LLP

(57) ABSTRACT

Embodiments of the present invention generally relate to heated substrate supports having a protective coating thereon. The protective coating is formed from yttrium oxide at a molar concentration ranging from about 50 mole percent to about 75 mole percent; zirconium oxide at a molar concentration ranging from about 10 mole percent to about 30 mole percent; and at least one other component, selected from the group consisting of aluminum oxide, hafnium oxide, scandium oxide, neodymium oxide, niobium oxide, samarium oxide, ytterbium oxide, erbium oxide, cerium oxide, and combinations thereof, at a molar concentration ranging from about 10 mole percent to about 30 mole percent. The alloying of yttrium oxide with a compatible oxide improves wear resistance, flexural strength, and fracture toughness of the protective coating, relative to pure yttrium oxide.

16 Claims, 5 Drawing Sheets

US 9,556,507 B2

YTTRIA-BASED MATERIAL COATED CHEMICAL VAPOR DEPOSITION CHAMBER HEATER

CROSS-REFERENCE TO RELATED APPLICATIONS

This application claims benefit of U.S. Provisional Patent Application Ser. No. 61/782,217, filed Mar. 14, 2013, which is herein incorporated by reference.

BACKGROUND OF THE INVENTION

Field of the Invention

Embodiments of the present invention generally relate to heated substrate supports.

Description of the Related Art

Process chambers and components present within process chambers which are used in the fabrication of electronic devices and micro-electromechanical structures (MEMS) and are frequently constructed from aluminum and aluminum-containing materials, such as aluminum nitride. However, the components are susceptible to erosion from halogen-containing cleaning plasma and gases frequently used to clean process chamber interiors. The erosion reduces the usable life of the process chamber components, and, additionally, introduces undesirable defects and contamination into the processing environment. The erosion of a heated substrate support is of particular concern due to the direct contact of the heated substrate support with processed substrates, affecting the wafer thermal uniformity, film deposition rate, and density. The erosion of a heated substrate support is of particular concern due to also the higher temperature and the easier formation of AlFx that redeposits on internal chamber surfaces, increasing the potential for introducing particle and contamination to the substrates.

Therefore, there is a need in the art for heated substrate support that is less susceptible to erosion.

SUMMARY OF THE INVENTION

Embodiments of the present invention generally relate to heated substrate supports having a protective coating thereon. The protective coating is formed from yttrium oxide at a molar concentration ranging from about 50 mole percent to about 75 mole percent; zirconium oxide at a molar concentration ranging from about 10 mole percent to about 30 mole percent; and at least one other component, selected from the group consisting of aluminum oxide, hafnium oxide, scandium oxide, neodymium oxide, niobium oxide, samarium oxide, ytterbium oxide, erbium oxide, cerium oxide, and combinations thereof, at a molar concentration ranging from about 10 mole percent to about 30 mole percent. The alloying of yttrium oxide with a compatible oxide improves wear resistance, flexural strength, and fracture toughness of the protective coating, relative to pure yttrium oxide.

In one embodiment, a substrate supporting comprises a heater plate having a protective coating disposed thereover. The protective coating comprises yttrium oxide at a molar concentration ranging from about 50 mole percent to about 75 mole percent; zirconium oxide at a molar concentration ranging from about 10 mole percent to about 30 mole percent; and at least one other component selected from the group consisting of aluminum oxide, hafnium oxide, scandium oxide, neodymium oxide, niobium oxide, samarium oxide, ytterbium oxide, erbium oxide, cerium oxide, and combinations thereof, at a molar concentration ranging from about 10 mole percent to about 30 mole percent.

In another embodiment, a method of processing a substrate support heater comprises applying a protective coating to a heater plate. The protective coating comprises yttrium oxide at a molar concentration ranging from about 50 mole percent to about 75 mole percent; zirconium oxide at a molar concentration ranging from about 10 mole percent to about 30 mole percent; and at least one other component selected from the group consisting of aluminum oxide, hafnium oxide, scandium oxide, neodymium oxide, niobium oxide, samarium oxide, ytterbium oxide, erbium oxide, cerium oxide, and combinations thereof.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to heated substrate supports having a protective coating thereon. The protective coating is formed from yttrium oxide at a molar concentration ranging from about 50 mole percent to about 75 mole percent; zirconium oxide at a molar concentration ranging from about 10 mole percent to about 30 mole percent; and at least one other component, selected from the group consisting of aluminum oxide, hafnium oxide, scandium oxide, neodymium oxide, niobium oxide, samarium oxide, ytterbium oxide, erbium oxide, cerium oxide, and combinations thereof, at a molar concentration ranging from about 10 mole percent to about 30 mole percent. The alloying of yttrium oxide with a compatible oxide improves wear resistance, flexural strength, and fracture toughness of the protective coating, relative to pure yttrium oxide.

Figure 1:
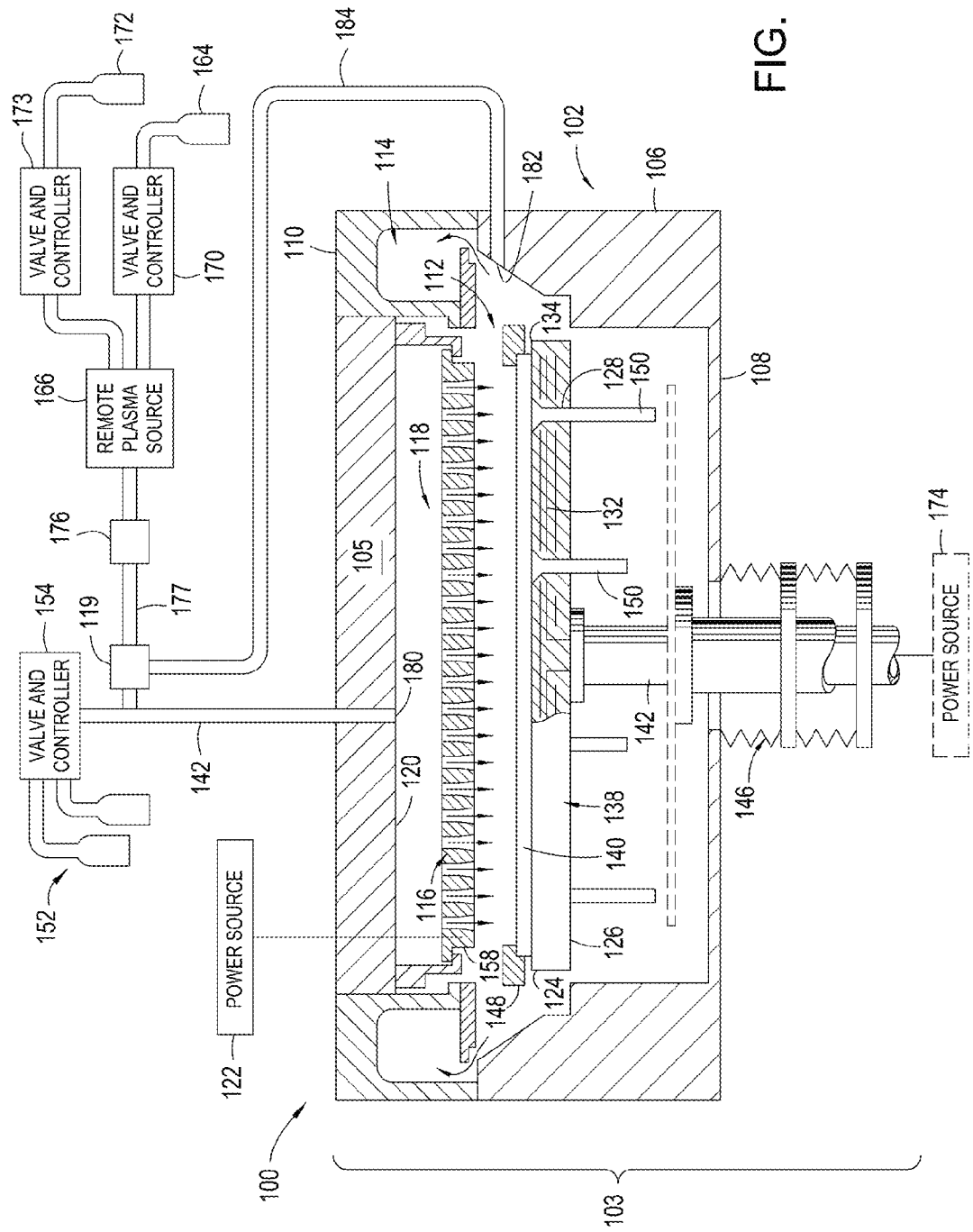
FIG. 1 is a schematic cross-sectional view of a chemical vapor deposition chamber according to an embodiment of the invention.

FIG. 1 is a schematic cross-sectional view of a chemical vapor deposition system 100 according to an embodiment of the invention. The system 100 generally includes a chemical vapor deposition chamber 103 coupled to a precursor supply 152. The chemical vapor deposition chamber 103 has sidewalls 106, a bottom 108, and a lid assembly 110 that define a processing volume or region 112 inside the chemical vapor deposition chamber 103. The processing region 112 is typically accessed through a port (not shown) in the sidewalls 106 that facilitate movement of a substrate 140 into and out of the chemical vapor deposition chamber 103. The sidewalls 106 and bottom 108 are typically fabricated from aluminum, stainless steel, or other materials compatible with processing. The sidewalls 106 support a lid assembly 110 that contains a pumping plenum 114 that couples the processing region 112 to an exhaust system that includes various pumping components (not shown). The sidewalls 106, bottom 108, and lid assembly 110 define the chamber body 102.

A gas inlet conduit or pipe 142 extends into an entry port or inlet 180 in a central lid region of the chamber body 102 and is connected to sources of various gases. A precursor supply 152 contains the precursors that are used during deposition. The precursors may be gases or liquids. The particular precursors that are used depend upon the materials that are to be deposited onto the substrate. The process gases flow through the inlet pipe 142 into the inlet 180 and then into the chamber 103. An electronically operated valve and flow control mechanism 154 controls the flow of gases from the gas supply into the inlet 180.

A second gas supply system is also connected to the chamber through the inlet pipe 142. The second gas supply system supplies gas or plasma that is used to clean, e.g., remove deposited material, the inside of the chamber after one or more chemical vapor deposition processes have been performed in the chamber. In some situations, the first and second gas supplies can be combined.

The second gas supply system includes a source 164 of a cleaning gas (or liquid), such as nitrogen trifluoride or sulfur hexafluoride, a remote plasma source 166 which is located outside and at a distance from the chemical vapor deposition chamber, an electronically operated valve and flow control mechanism 170, and a conduit or pipe 177 connecting the remote plasma source to the chemical vapor deposition chamber 103. Such a configuration allows interior surfaces of the chamber to be cleaned using a remote plasma source.

The second gas supply system also includes one or more sources 172 of one or more additional gases (or liquids) such as oxygen or a carrier gas. The additional gases are connected to the remote plasma source 166 through another valve and flow control mechanism 173. The carrier gas aids in the transport of the reactive species generated in the remote plasma source to the deposition chamber and can be any nonreactive gas that is compatible with the particular cleaning process with which it is being used. For example, the carrier gas may be argon, nitrogen, or helium. The carrier gas also may assist in the cleaning process or help initiate and/or stabilize the plasma in the chemical vapor deposition chamber.

Optionally, a flow restrictor 176 is provided in the conduit 177. The flow restrictor 176 can be placed anywhere in the path between the remote plasma source 166 and the deposition chamber 103. The flow restrictor 176 allows a pressure differential to be provided between the remote plasma source 166 and the deposition chamber 103. The flow restrictor 176 may also act as a mixer for the gas and plasma mixture as it exits the remote plasma source 166 and enters the deposition chamber 103.

The valve and flow control mechanism 170 delivers gas from the source 164 into the remote plasma source 166 at a user-selected flow rate. The remote plasma source 166 may be an RF plasma source, such as an inductively coupled remote plasma source. The remote plasma source 166 activates the gas or liquid from the source 164 to form reactive species which are then flowed through the conduit 177 and the inlet pipe 142 into the deposition chamber through the inlet 180. The inlet 180 is, therefore, used to deliver the reactive species into the interior region of the chemical vapor deposition chamber 103.

The lid assembly 110 provides an upper boundary to the processing region 112. The lid assembly 110 includes a central lid region 105 in which the inlet 180 is defined. The lid assembly 110 typically can be removed or opened to service the chemical vapor deposition chamber 103. In one embodiment, the lid assembly 110 is fabricated from aluminum (Al). The lid assembly 110 includes a pumping plenum 114 formed therein coupled to an external pumping system (not shown). The pumping plenum 114 is utilized to channel gases and processing by-products uniformly from the processing region 112 and out of the chemical vapor deposition chamber 103.

The gas distribution assembly 118 is coupled to an interior side 120 of the lid assembly 110. The gas distribution assembly 118 includes a perforated area 116 in a gas distribution plate 158 through which gases, including reactive species generated by the remote plasma source and processing gases for chemical vapor deposition, are delivered to the processing region 112. The perforated area 116 of the gas distribution plate 158 is configured to provide uniform distribution of gases passing through the gas distribution assembly 118 into the processing region 112.

The gas distribution plate 158 is typically fabricated from stainless steel, aluminum (Al), anodized aluminum, nickel (Ni) or another RF conductive material. The gas distribution plate 158 is configured with a thickness that maintains sufficient flatness and uniformity so as to not adversely affect substrate processing. In one embodiment the gas distribution plate 158 has a thickness between about 1.0 inch and about 2.0 inches.

In addition to inlet 180, the chamber body 102 may optionally include a second inlet 182 that provides reactive species from a remote plasma source. The remote plasma source may be the same remote plasma source 166 that provides reactive species to the processing region through the inlet 180 via the gas distribution assembly 118. The second inlet 182 is configured to provide reactive species from the remote plasma source into the processing region 112 of the chamber 103 while bypassing the gas distribution assembly 118. In other words, the reactive species provided by the second inlet 182 do not pass through the perforated gas distribution plate 158 of the gas distribution assembly 118. The second inlet 182 may be located in a sidewall 106 of the chamber body 102 below the gas distribution assembly 118, such as between the gas distribution plate 158 and the substrate support 124. A gas line 184 from the remote plasma source to the second inlet 182 delivers reactive species from the remote plasma source to the processing region 112 of the chamber 103 through the second inlet 182. In such an embodiment, a diverter 119 is provided in the conduit 177 from the remote plasma source. The diverter 119 allows a first portion of the reactive species from the remote plasma source 166 to be directed to the first inlet 180 of the chamber 103 via pipe 142 between the diverter 119 and the chamber 103 and a second portion of the reactive species from the remote plasma source to be directed to the second inlet 182 of the chamber via line 184 between the diverter 119 and the chamber 103.

A temperature controlled substrate support assembly 138 is centrally disposed within the chamber 103. The support assembly 138 supports a substrate 140 during processing. In one embodiment, the substrate support assembly 138 comprises a substrate support 124 having an aluminum or aluminum nitride body that encapsulates at least one embedded heater 132. The heater 132, such as a resistive element, disposed in the support assembly 138, is coupled to an optional power source 174 and controllably heats the support assembly 138 and the substrate 140 positioned thereon to a predetermined temperature.

Generally, the support assembly 138 has a substrate support 124 comprising a lower side 126 and an upper side 134. The upper side 134 supports the substrate 140. The lower side 126 has a stem 142 coupled thereto. The stem 142 couples the support assembly 138 to a lift system (not shown) that moves the support assembly 138 between an elevated processing position (as shown) and a lowered position that facilitates substrate transfer to and from the chemical vapor deposition chamber 103. The stem 142 additionally provides a conduit for electrical and thermocouple leads between the support assembly 138 and other components of the system 100.

A bellows 146 is coupled between support assembly 138 (or the stem 142) and the bottom 108 of the chemical vapor deposition chamber 103. The bellows 146 provides a vacuum seal between the processing region 112 and the atmosphere outside the chemical vapor deposition chamber 103 while facilitating vertical movement of the support assembly 138.

The support assembly 138 generally is grounded such that RF power supplied by a power source 122 to the gas distribution assembly 118 positioned between the lid assembly 110 and substrate support assembly 138 (or other electrode positioned within or near the lid assembly of the chamber) may excite gases present in the processing region 112 between the support assembly 138 and the gas distribution assembly 118. The support assembly 138 additionally supports a circumscribing shadow frame 148. Generally, the shadow frame 148 prevents deposition at the edge of the substrate 140 and support assembly 138 so that the substrate does not adhere to the support assembly 138. The support assembly 138 has a plurality of holes 128 disposed therethrough that accept a plurality of lift pins 150.

Figure 2:
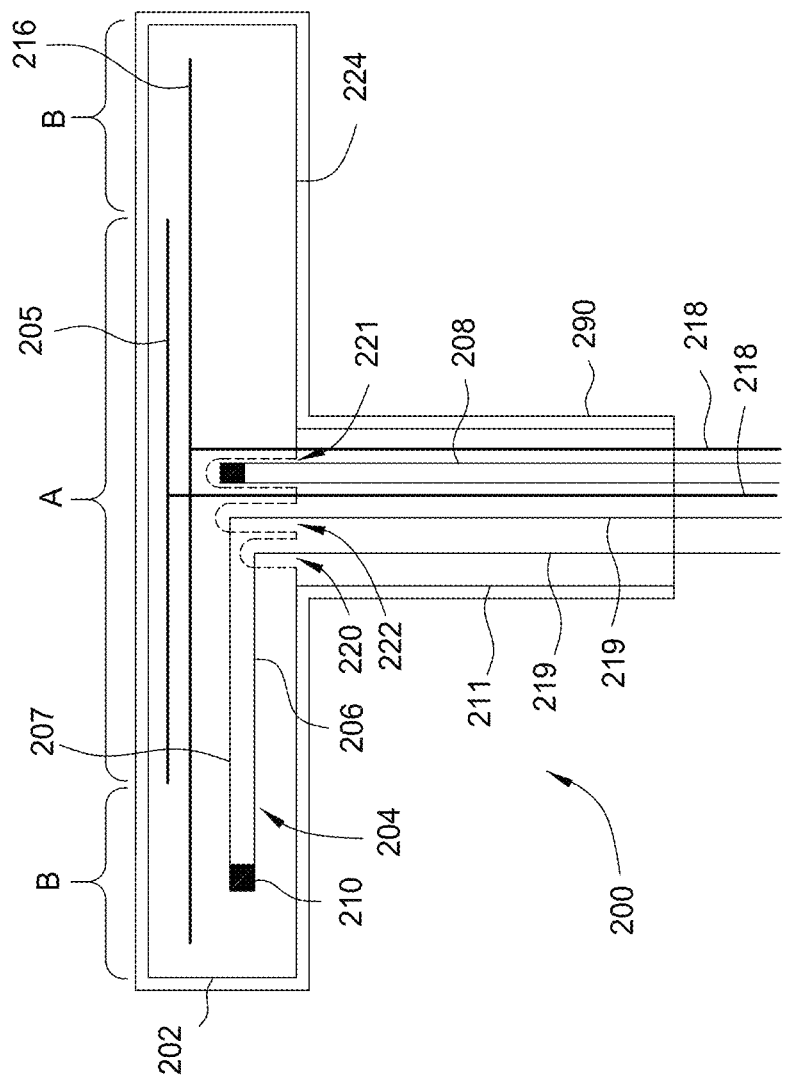
FIG. 2 depicts a schematic representation of a multi-zone heater pedestal assembly according to an embodiment of the present invention.

FIG. 2 depicts a schematic representation of a multi-zone heater pedestal assembly 200 according to embodiments of the present invention. The multi-zone heater pedestal assembly 200 may be used in place of the substrate support 124 illustrated in FIG. 1. The multi-zone heater pedestal assembly 200 includes a heater plate 202 having thermocouples 204, 208, a first heating element 205, and a second heating element 216 embedded therein. The first heating element 205 is adapted to provide thermal energy to a first zone A of the heater plate 202. The second heating element 216 is adapted to provide thermal energy to a second zone B disposed radially outward of the first zone A. The heating elements 205 and 216 may be resistive heating elements shaped as wires, rings, plates, or the like. The thermocouple 204 is adapted to measure the temperature of zone B of the heater plate 202, while the thermocouple 208 is adapted to measure the temperature of zone A of the heater plate 202.

In some embodiments, the thermocouple 204 includes longitudinal pieces 206, 207. The longitudinal pieces 206, 207 may be shaped as bars, wires, strips, or any other practicable shape that can both extend radially from the center of the heater plate 202 to an outer heating zone of the heater plate 202 and also have sufficient surface area at both ends to allow formation of reliable electrical connections. At a junction end 210 of the longitudinal pieces 206, 207, the longitudinal pieces 206, 207 may be welded together and/or otherwise connected using a conductive filler material. In embodiments where the thermocouple junction 210 is formed by welding, a welding method should be chosen which would allow the junction 210 to remain intact and tolerate the heat applied during the sintering process. For example, tungsten inert gas (TIG) welding or similar techniques may be used to weld a piece of W5Re, W26Re or other conductive materials to the W5Re and W26Re longitudinal pieces 206, 207 to form welding junctions that will not melt during sintering.

The heater plate 202 includes openings 220, 222 near the center of the lower surface 224 of the plate 202. The openings 220, 222 extend into the heater plate 202 to expose the longitudinal pieces 206, 207 to facilitate a connection therewith. Any practicable method (e.g., drilling) of opening a hole in the heater plate 202 may be used to form the openings 220, 222. The openings 220, 222 are made of sufficient diameter to allow connectors 219 (e.g., conductive wires) to be connected to the longitudinal pieces 206, 207.

In some embodiments, the connectors 219 are brazed, welded, or soldered to the longitudinal pieces 206, 207. The brazing process may be performed in an oxygen free environment to avoid oxidation of the materials. In addition, an opening 221 may be opened to insert the thermocouple 208 into the heater plate 202 for the inner heating zone A. Note that although not shown, additional openings to facilitate connections between connectors 218 and the heating elements 205, 216 may also be formed in the heater plate 202. A shaft 211 is coupled to the lower surface 224 of the heater plate 202. The shaft 211 is centrally positioned relative to the lower surface 224. The shaft 211 houses the connectors 218, 219 and supports the heater plate 202 within a process chamber.

In some embodiments, during manufacturing, the heater plate 202 may be formed using a hot press sintering process in which aluminum nitride (AlN) in powder form may be pressed into a mold and heated. In another embodiment, the heater plate 202 may be formed by layering AlN powder into the mold, positioning the first heating element 205 on the first layer of AlN, depositing a second layer of AlN powder over the first heating element 205, positioning the second heating element 216 on the second layer of AlN powder, adding a third layer of AlN powder over the second heating element 216, positioning the thermocouple 204 on the third layer of AlN, and then depositing a fourth layer of AlN powder over the thermocouple 204. Once the layers of AlN powder, the elements 205, 216, and the thermocouple 204 are in place, high pressure and high temperature may be applied to the structure to induce sintering. Note that the above example describes steps for forming a two zone heater plate. In other embodiments, 3, 4, 5, and 6 or more zone heater plates may be made with appropriate corresponding layering steps and additional heating elements and thermocouples.

The multi-zone heater pedestal assembly 200 also includes a protective coating 290 thereon. The protective coating 290 is resistant to erosion by halogen-containing plasmas used in semiconductor processing to clean process chambers. The protective coating 290 includes ceramic which is multi-phased, typically including two phases to three phases. The protective coating 290 is formed from yttrium oxide at a molar concentration ranging from about 50 mole percent to about 75 mole percent; zirconium oxide at a molar concentration ranging from about 10 mole percent to about 30 mole percent; and at least one other component, selected from the group consisting of aluminum oxide, hafnium oxide, scandium oxide, neodymium oxide, niobium oxide, samarium oxide, ytterbium oxide, erbium oxide, cerium oxide, and combinations thereof, at a molar concentration ranging from about 10 mole percent to about 30 mole percent. The alloying of yttrium oxide with a compatible oxide improves wear resistance, flexural strength, and fracture toughness of the protective coating 290, as compared to pure yttrium oxide.

In one example, the protective coating 290 may have the following composition: yttrium oxide 100 parts by weight, zirconium oxide 20 parts by weight, and aluminum oxide 10 parts by weight. This composition is the same as 63 mole percent yttrium oxide, 23 mole percent zirconium oxide, and 14 mole percent aluminum oxide. In another example, the protective coating 290 may have the following composition: yttrium oxide 100 parts by weight, zirconium oxide 20 parts by weight, and aluminum oxide 20 parts by weight. This composition is the same as 55 mole percent yttrium oxide, 20 mole percent zirconium oxide, and 25 mole percent aluminum oxide.

The compositions of the protective coating 290 described herein provide excellent erosion resistance to halogen containing plasmas while providing advanced mechanical properties. The advanced mechanical properties enable longer lifetime due to increased wear resistance, as well as facilitate handling of components with less concern about damage to a component. The addition of a concentration of zirconium oxide, ranging from about 0.1 mole percent to about 65 mole percent to yttrium oxide, provides a solid solution of yttrium oxide and zirconium oxide with the cubic yttria crystal structure or cubic fluorite-type crystal structure, where the cell parameter is smaller than that of the pure structure, due to the formation of yttrium vacancy/oxygen vacancy, respectively. The smaller cell parameter of the solid solution crystal structure improves the plasma resistance properties of the solid solution of zirconium oxide in yttrium oxide. The protective coating 290 may be applied, for example, by plasma spraying or chemical vapor deposition (CVD).

The following table illustrates one example of processing parameters for plasma spraying the protective coating 290.

| Parameter | Unit | Range |
|---|---|---|
| Plasma Power | kW | 50-90 |
| Power Current | A | 100-160 |
| Power Voltage | V | 260-310 |
| Powder Feed Rate | g/min | 5-100 |
| Distance | mm | 60-150 |
| Gun Moving Speed | mm/sec | 600-3000 |
| Gun Angle | Degree | 45-90 |
| Gun Air-Blow Angle | Degree | 45-90 |
| Plasma Gas (Ar) | L/min | 0-100 |
| Plasma Gas ($O_2$) | L/min | 0-100 |
| Substrate Temp | Degree C. | 25-300 |
| Coating Thickness | Micrometer | 20-300 |
| Thickness per Pass of Gun | Micrometer/pass | 1-100 |
| Surface Roughness | Micrometer | 1-10 |

Figure 3:
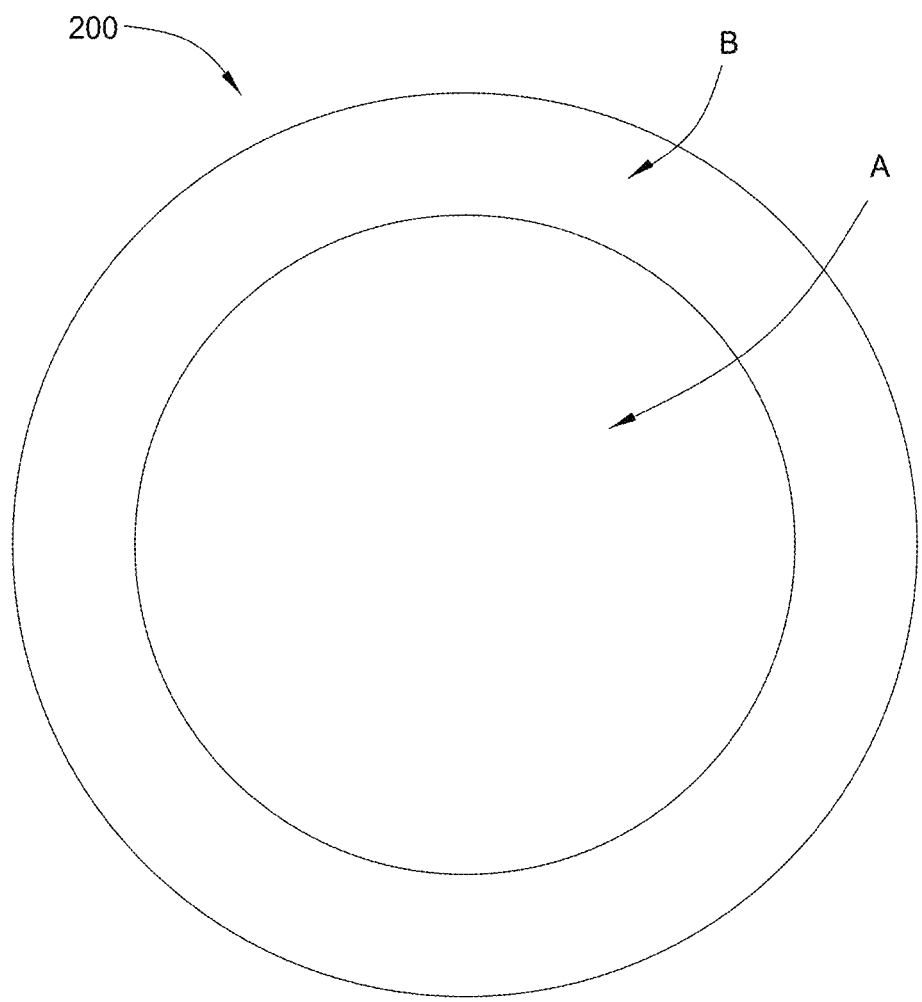
FIG. 3 illustrates a top view of the multi-zone heater pedestal assembly shown in FIG. 2.

FIG. 3 illustrates a top view of the multi-zone heater pedestal assembly 200 shown in FIG. 2. The multi-zone heater pedestal assembly 200 includes an outer zone B heated by a heating element 216 (shown in FIG. 2) and an inner zone A heated by a heating element 205. Zone B circumscribes zone A. Although only two zones are shown, it is contemplated that the multi-zone heater pedestal assembly 200 may include more than two zones and more than two respective heating elements. It is also contemplated that other heaters, including singe zone heaters, may be coated with coatings described herein.

Figure 4:
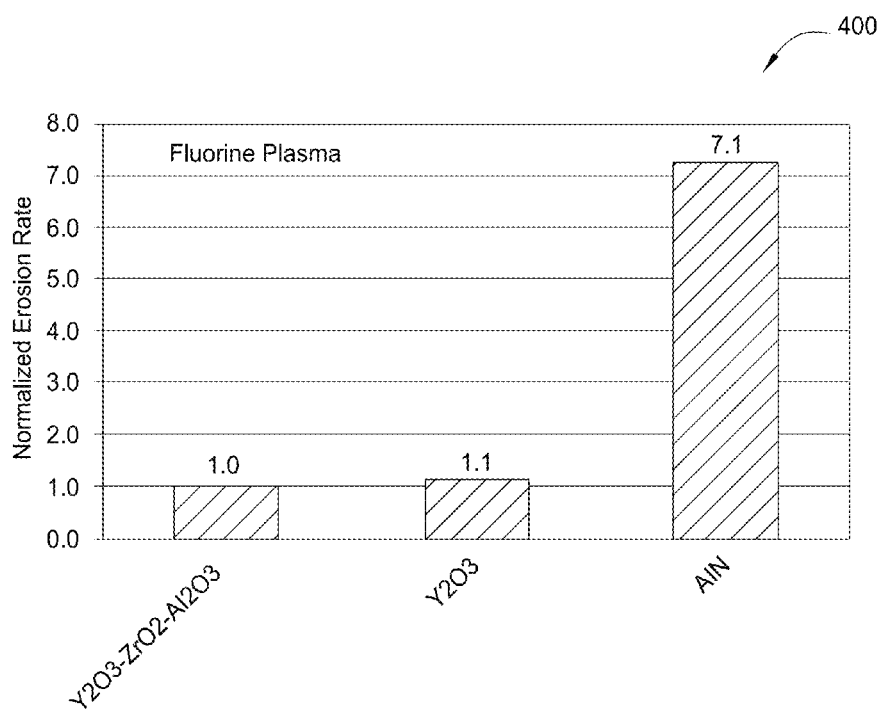
FIG. 4 illustrates graph 400 that shows the relative erosion rates between $Y_2O_3$, AlN, and a protective coating formed from yttrium oxide at a molar concentration ranging from about 50 mole percent to about 75 mole percent; zirconium oxide at a molar concentration ranging from about 10 mole percent to about 30 mole percent; and at least one other component, selected from the group consisting of aluminum oxide, hafnium oxide, scandium oxide, neodymium oxide, niobium oxide, samarium oxide, ytterbium oxide, erbium oxide, cerium oxide, and combinations thereof, at a molar concentration ranging from about 10 mole percent to about 30 mole percent.

FIG. 4 illustrates graph 400 that shows the relative erosion rates between $Y_2O_3$, AlN, and a protective coating is formed from yttrium oxide at a molar concentration ranging from about 50 mole percent to about 75 mole percent; zirconium oxide at a molar concentration ranging from about 10 mole percent to about 30 mole percent; and at least one other component, selected from the group consisting of aluminum oxide, hafnium oxide, scandium oxide, neodymium oxide, niobium oxide, samarium oxide, ytterbium oxide, erbium oxide, cerium oxide, and combinations thereof, at a molar concentration ranging from about 10 mole percent to about 30 mole percent (e.g., protective coating 290). As illustrated, AlN has an erosion rate that is seven-fold the other materials. Thus, by coating an AlN heater with the protective coating 290, the lifetime of the heater is greatly increased, and surface erosion is reduced.

After depositing the protective coating 290 on the multi-zone heater pedestal assembly 200, the protective coating 290 may be polished to reduce surface roughness. However, the polished surface may be prone to particle contaminants adhering thereto. Additionally, the plasma spray utilized to deposit the protective coating 290 may results in cracks or pores present within the protective coating 290, thus increasing the likelihood of exposing the underlying heater assembly to a corrosive plasma. In one embodiment, the protective coating 290 may be subjected to a thermal treatment to reduce pores, cracks, and/or defects therein, as well as to remove adsorbed particles.

Figure 5A:
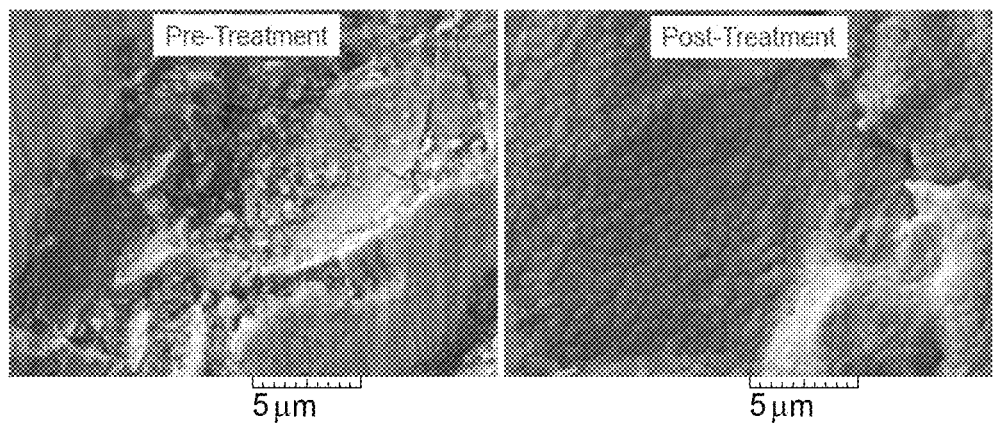
FIGS. 5A and 5B illustrate a coating before and after thermal treatment.
Figure 5B:
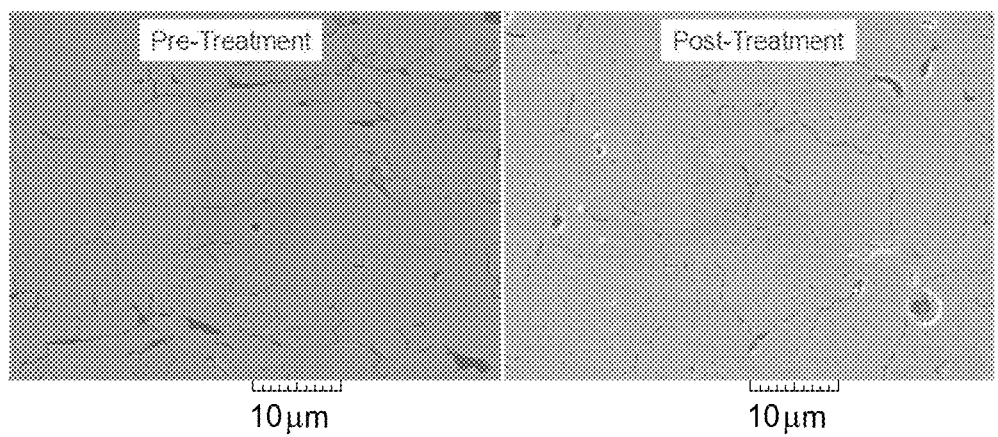

In one example, the thermal treatment may include heating the protective coating to a temperature within a range of about 1200 degrees Celsius to about 1800 degrees Celsius in a nitrogen or argon atmosphere for about 30 minutes to about 24 hours. During the thermal treatment, two types of reactions occur at the AlN/coating 290 interface: (1) grain surface high energy atoms migrate to a grain boundary to dissolve and then regrow in the grain, and (2) grain surface high energy atoms are vaporized. After thermal treatment, pores, cracks, and defects are significantly reduced, and adhered particles are removed. It is believed that the coating reacts with the underlying AlN heater to form a relatively dense transition layer that blocks the plasma chemistry from penetrating to react with the heater assembly, as well as prevents the coating 290 from peeling off. FIGS. 5A and 5B illustrate the coating 290 before and after thermal treatment. As shown in FIG. 5A, adhered particles are significantly removed after thermal treatment. As shown in FIG. 5B, cracks and pores are significantly reduced after thermal treatment.

Benefits of the invention include increased erosion resistance for heated substrate supports. The increased erosion resistance reduces contamination in a process chamber, particularly for components which are often in physical contact with substrates to be processed.

While the foregoing is directed to embodiments of the present invention, other and further embodiments of the invention may be devised without departing from the basic scope thereof, and the scope thereof is determined by the claims that follow.

We claim:

1. A substrate support, comprising:
   a heater plate comprising aluminum nitride;
   a protective coating disposed over the heater plate, the protective coating comprising:
   yttrium oxide at a molar concentration ranging from about 50 mole percent to about 75 mole percent;
   zirconium oxide at a molar concentration ranging from about 10 mole percent to about 30 mole percent; and
   at least one other component selected from the group consisting of aluminum oxide, hafnium oxide, scandium oxide, neodymium oxide, niobium oxide, samarium oxide, ytterbium oxide, erbium oxide, cerium oxide, and combinations thereof; and
   a transition layer formed between the heater plate and the protective coating by thermally treating the protective coating at a temperature within a range of about 1200 degrees Celsius to about 1800 degrees Celsius.

2. The substrate support of claim 1, wherein the at least one other component has a molar concentration ranging from about 10 mole percent to about 30 mole percent.

3. The substrate support of claim 1, further comprising a plurality of resistive elements disposed within the heater plate.

4. The substrate support of claim 1, further comprising a shaft coupled to the heater plate.

5. The substrate support of claim 1, wherein the yttrium oxide has a molar concentration of about 63 mole percent, the zirconium oxide has a molar concentration of about 23 mole percent, and the at least one other component is aluminum oxide and has a molar concentration of about 14 mole percent.

6. The substrate support of claim 1, wherein the yttrium oxide has a molar concentration of about 50 mole percent, the zirconium oxide has a molar concentration of about 20 mole percent, and the at least one other component is aluminum oxide and has a molar concentration of about 25 mole percent.

7. The substrate support of claim 1, wherein the at least one other component is aluminum oxide.

8. The substrate support of claim 1, wherein the protective coating has a thickness of about 20 micrometers to about 300 micrometers.

9. The substrate support of claim 1, wherein the protective coating has a surface roughness of about 1 micrometer to about 10 micrometers.

10. The substrate support of claim 1, wherein the heating plate includes multiple heating zones.

11. A method of processing a substrate support heater, comprising:
    applying a protective coating to a heater plate comprising aluminum nitride, the protective coating comprising:
    yttrium oxide at a molar concentration ranging from about 50 mole percent to about 75 mole percent;
    zirconium oxide at a molar concentration ranging from about 10 mole percent to about 30 mole percent; and
    at least one other component selected from the group consisting of aluminum oxide, hafnium oxide, scandium oxide, neodymium oxide, niobium oxide, samarium oxide, ytterbium oxide, erbium oxide, cerium oxide, and combinations thereof; and
    thermally treating the protective coating at a temperature within a range of about 1200 degrees Celsius to about 1800 degrees Celsius to form a transition layer between the protective coating and the heater plate.

12. The method of claim 11, wherein the protective coating is applied by plasma spraying.

13. The method of claim 11, wherein the protective coating is applied using chemical vapor deposition.

14. The method of claim 11, wherein the at least one other component is aluminum oxide.

15. The method of claim 11, wherein the yttrium oxide has a molar concentration of about 63 mole percent, the zirconium oxide has a molar concentration of about 23 mole percent, and the at least one other component is aluminum oxide and has a molar concentration of about 14 mole percent.

16. The method of claim 11, wherein during the thermally treating, the protective coating partially reacts with the aluminum nitride.

* * * * *